US 8,031,042 B2

(12) United States Patent
Silva

(10) Patent No.: US 8,031,042 B2
(45) Date of Patent: Oct. 4, 2011

(54) POWER CONVERTER MAGNETIC DEVICES

(75) Inventor: Arturo Silva, Allen, TX (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 12/474,016

(22) Filed: May 28, 2009

(65) Prior Publication Data

US 2009/0295524 A1    Dec. 3, 2009

Related U.S. Application Data

(60) Provisional application No. 61/056,706, filed on May 28, 2008.

(51) Int. Cl.
*H01F 27/28* (2006.01)
*H01F 17/24* (2006.01)
*H01F 17/06* (2006.01)

(52) U.S. Cl. ......... 336/212; 336/178; 336/221; 336/220

(58) Field of Classification Search .................. 336/178, 336/212, 214, 221, 220
See application file for complete search history.

(56) References Cited

U.S. PATENT DOCUMENTS

| | | | | |
|---|---|---|---|---|
| 4,803,609 A | * | 2/1989 | Gillett et al. | 363/17 |
| 5,182,535 A | * | 1/1993 | Dhyanchand | 336/12 |
| 5,747,981 A | * | 5/1998 | Callanan | 323/362 |
| 6,657,529 B1 | * | 12/2003 | Albach | 336/182 |
| 6,965,289 B2 | * | 11/2005 | Toi et al. | 336/83 |
| 6,967,553 B2 | * | 11/2005 | Jitaru | 336/178 |
| 7,522,028 B2 | * | 4/2009 | Sano | 336/212 |
| 7,598,839 B1 | * | 10/2009 | Wedley | 336/212 |
| 2004/0239463 A1 | * | 12/2004 | Poniatowski et al. | 336/10 |
| 2006/0290458 A1 | * | 12/2006 | Sano | 336/212 |
| 2007/0247270 A1 | * | 10/2007 | Fushimi et al. | 336/212 |

* cited by examiner

*Primary Examiner* — Anh Mai
(74) *Attorney, Agent, or Firm* — Marsh Fischmann & Breyfogle LLP

(57) ABSTRACT

Magnetic structures for use in components utilized in switched mode power supplies can be combined to provide space and cost savings. Portions of magnetic cores can be utilized to form more than one component and/or separate magnetic cores can be combined into a single core. Further, a layer of material that has a higher flux density saturation point than the core and that is lower in permeability than the core (but higher than that of air) can be placed adjacent to the air gap in a core to decrease the magnetic flux passing through the vicinity surrounding the core so as to reduce EMI. A differential-mode choke and a separate common-mode choke can be combined onto a single core. An extra leg for a PFC choke core can be added to an isolation transformer core to form a single combined core. A pair of E-E core structures can be combined into a single core structure such as could be used to combine a pair of separate PFC chokes into an integrated pair of PFC chokes.

18 Claims, 8 Drawing Sheets

MAGNETIC FLUX

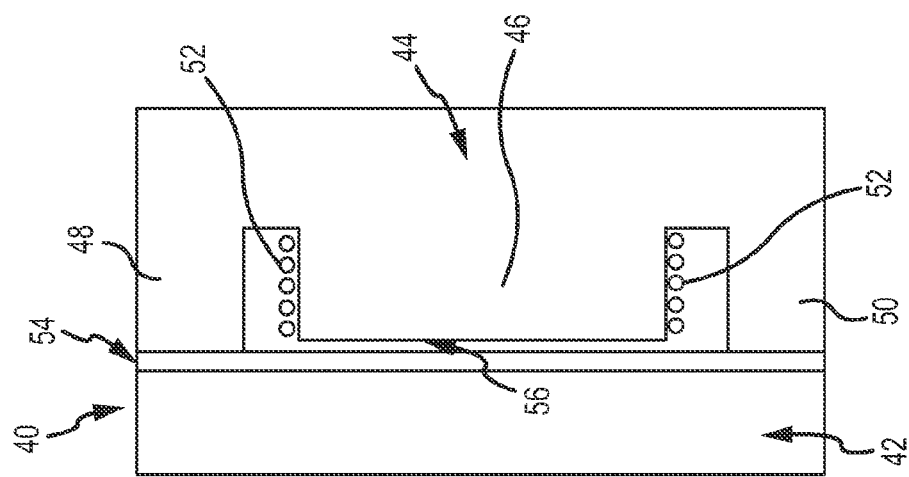
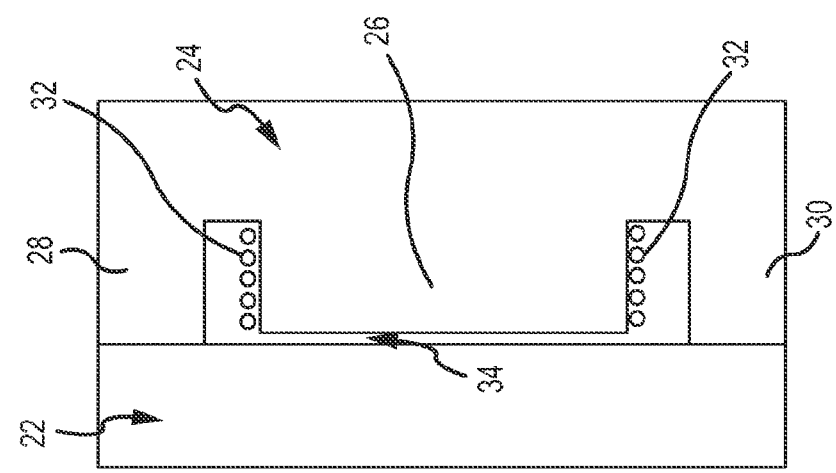

PFC CHOKE CORE    ISOLATION TRANSFORMER CORE

MAGNETIC FLUX

INTEGRATED PFC CHOKES IN AN INTERLEAVED PFC CONVERTER

POWER CONVERTER MAGNETIC DEVICES

This application claims priority under 35 U.S.C. 119 to U.S. Provisional Application No. 61/056,706, entitled: "TECHNIQUES FOR POWER CONVERSION," filed on May 28, 2008, the contents of which are incorporated herein as if set forth in full.

BACKGROUND

Presented herein are various techniques for use in power conversion devices. Generally, a power converter is a power supply unit that delivers energy to an electronic device, and may also regulate the current to meet the device's specific requirements. Power converters are commonly used in consumer electronics such as computers, laptops, audio equipment, cell phones, or the like.

One type of power converter is a Switched Mode Power Supplies (SMPS). An SMPS may include a power supply unit and a circuit inside the unit to regulate the current. The circuit moves extremely fast, regulating the current so that it can stabilize it to a set voltage that is then sent directly to the device. Because of weight, economic and convenience factors, SMPS are the device of choice to power most consumer electronics that need stable current and voltage. However, they must be designed carefully to provide power with acceptable efficiency and minimal noise.

To meet these requirements, power converters may include one or more stages that include one or more magnetic components including filters, transformers, inductors, or the like. Generally, the techniques described herein are directed to improvements in the various magnetic components that are utilized by power converters.

SUMMARY

The following embodiments and aspects of thereof are described and illustrated in conjunction with systems, tools, and methods which are meant to be exemplary and illustrative, and not limiting in scope. In various embodiments, one or more of the above-described problems have been reduced or eliminated, while other embodiments are directed to other improvements.

Disclosed is an inductive element for an electronic circuit. The element includes a magnetic core assembly having an air gap, the core assembly having an overall permeability, the core assembly being composed of a first material for at least a substantial majority of the assembly, the first material having a permeability, and having a layer of material having a permeability higher than the overall permeability and lower than the permeability of the first material adjacent to at least one side of the air gap. The element also includes a coil of conductive material circumferentially surrounding at least a portion of the core assembly.

The layer of material may include NiZn. The layer of material may include iron powder. The magnetic core assembly may include an E-section and an I-section. The I-section may include the layer of material on a side adjacent the E-section. The layer may have a permeability greater than 300u and the overall permeability of the core assembly may be less than 300u. The first material may have a permeability greater than 2000u and the layer may have a permeability less than 1000u.

Also disclosed is an inductive element for an electronic circuit in which the element includes a magnetic core assembly having three core legs around which windings can be provided, including a first leg, a second leg, and a third leg, wherein the third leg includes an air gap such that the third leg is divided into two leg sections. The element also includes a first winding around the first leg, a second winding around the second leg, and a third winding and a fourth winding around respective ones of the two leg sections of the third leg. The first and second windings are used for filtering common-mode noise and the third, and fourth windings are used for filtering differential-mode noise.

The first winding may have the same number of turns as the second winding and the third winding may have the same number of turns as the fourth winding. A first end of the first leg, the second leg, and the third leg may all be attached to a top core element and a second end of the first leg, the second leg, and the third leg may all be attached to a bottom core element.

Also disclosed is an inductive element assembly for an electronic circuit in which the assembly includes a first inductive element having a first magnetic core and a first pair of windings and a second inductive element having a second magnetic core and a second pair of windings. The second magnetic core is connected to the first magnetic core and the magnetic flux generated by the second inductive element passes from the second magnetic core to the first magnetic core and back to the second magnetic core.

The second inductive element may be shaped as a E-section. The first inductive element may be shaped as a pair of E-sections. The current flowing in the first and second pair of windings may be synchronized so that the peak current does not flow through the two pair of windings simultaneously.

Also disclosed is an inductive element assembly for an electronic circuit, in which the assembly includes a first inductive element having a first magnetic core and a first pair of windings and a second inductive element having a second magnetic core and a second pair of windings. The first inductive element and the second inductive element have substantially the same cross-sectional shape, and the two inductive elements are stacked on top of each other.

The first inductive element and the second inductive element may have substantially the same cross-sectional size. The assembly may further include a third inductive element having a third magnetic core and a third pair of windings, wherein the third inductive element has substantially the same cross-sectional shape as the first inductive element and the second inductive element, and further wherein the three inductive elements are stacked on top of each other. The first magnetic core may include an Ejection and a common core section, and further wherein the second magnetic core includes an E-section and the common core section. The common core section may be formed in the shape of a pair of E-sections that are joined together with their longest longitudinal sections abutted against each other. The current flowing in the first and second pair of windings may be synchronized so that the peak current does not flow through the two pair of windings simultaneously.

In addition to the exemplary aspects and embodiments described above, further aspects and embodiments will become apparent by reference to the drawings and by study of the following descriptions.

BRIEF DESCRIPTION OF THE DRAWINGS

FIG. 1 is a representation of a prior art inductor core structure.

FIG. 2 is a representation of an inventive prior art core structure.

DETAILED DESCRIPTION

Figure 3:
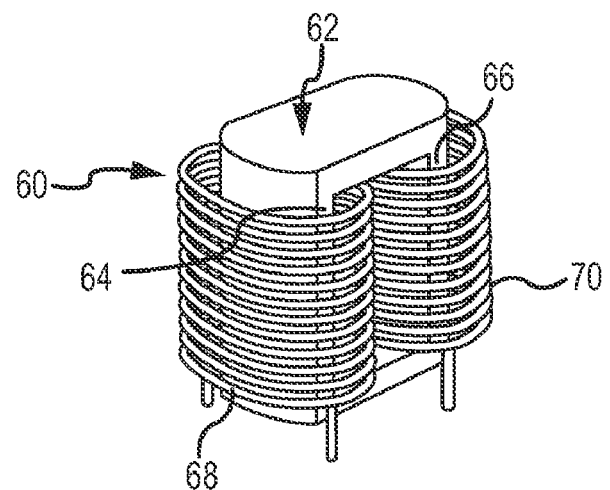
FIG. 3 is a representation of a prior art choke that can be used to filter either common-mode noise of differential-mode noise.

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope and spirit of the invention as defined by the claims.

Taught herein are various techniques that can be used to optimize or improve magnetic devices in power converters. Low-power PFC converters typically use a boost converter to boost a rectified AC source voltage to a high-voltage bus using critical-conduction-mode (CRM) operation. Use of CRM operation produces a low-cost converter; however, it also requires an inductor having a small inductance value with a large air gap that operates over a large frequency range. In practice, the large air gap allows a significant amount of radiated energy to escape from the inductor. The large frequency range may cause significant EMI problems, thus causing a large amount of broadband frequency EMI to radiate from the inductor into other parts of the circuit and ultimately radiate from the converter box as well as the AC line cord. The broadband nature of the radiation requires a large EMI filter to prevent the noise from exiting the AC line cord. Current technologies either use a large EMI filter to filter the broadband noise or they add shielding to the PFC inductor to prevent the noise from radiating from the air gap.

Air gaps in PFC inductors are sometimes filled with a relatively low permeability material (such as iron powder) to distribute the air gap over a larger length and reduce the power losses often associated with the air gap. The large EMI filter presents challenges to reducing the size of an adapter or other power converter. There is currently a trend to significantly reduce the size of power adapters. This requires high efficiency designs with reduced filter sizes. Current methods of reducing EMI involve either increasing the size of the EMI filter or adding shielding to the inductor. The added shielding in the inductor reduces efficiency. Therefore, both of the current methods cause problems in reduction of the adapter size, as well as causing the overall cost of the converter to increase.

The techniques taught herein include using a relatively high permeability material (that does not easily saturate) in the air gap of the inductor. The high permeability material effectively attracts the escaping radiation of the inductor back into the inductor. The amount of radiated noise is thus reduced without the need for increasing EMI filtering or inductor shielding. The efficiency of the inductor also remains high because losses due to energy dissipated into a shield are reduced.

FIGS. 1 and 2 illustrate two inductor core structures. FIG. 1 shows a prior art core structure 20 that includes an I-shaped core 22 abutted against an E-shaped core 24. The E-shaped core 24 includes a center leg 26 and two outer legs 28 and 30. Coils of a conductor 32 are wrapped around the center leg 26 of the E-shaped core 24. As can be seen, an air gap 34 is formed between the center leg 26 of the E-shaped core 24 and an edge of the I-shaped core 22. No matter the material used for the cores 22 and 24, the effective permeability of the core structure 20 will be decreased due to the presence of the air gap 34. Further, the air gap 34 causes a significant amount of magnetic flux to pass through the air both in the gap 34 and in the surrounding vicinity to the gap 34. This flux causes radiated electromagnetic interference (EMI) which may be detrimental to the operation of nearby electronic devices. In many cases, a conductive band of metal (e.g., copper) is employed to surround the entire core structure 20.

FIG. 2 illustrates a similar inductor core structure, wherein a portion of the right side of the I-shaped core has been replaced by a relatively high permeability material that is not easily saturated (e.g., nickel zinc (NiZn)). The material is relatively high in permeability relative to air, but relatively low compared to the remainder of the core. In this case, a core structure 40 includes an I-shaped core 42 and an E-shaped core 44. The E-shaped core 44 includes a center leg 46 and two outer legs 48 and 50. Coils of a conductor 52 are wrapped around the center leg 46 of the E-shaped core 44. Unlike the core structure 20, this core structure 40 also includes a layer 54 of high permeability (relative to air) material that is sandwiched between the I-shaped core 42 and the E-shaped core 44. An air gap 56 is formed in this case between the center leg 46 of the E-shaped core 44 and an edge of the high permeability layer 54. It should be appreciated that the term high permeability refers to a material that has a higher permeability than the overall permeability of the core structure. By positioning this higher permeability material on the edge of the I-shaped core, the high permeability material acts as a low reluctance path for the magnetic flux, which reduces the fringe flux that causes undesirable EMI. Not only is the high permeability layer higher in permeability than air, but it is significantly lower in permeability than the ferrite core.

Thus, this layer 54 provides several benefits. First, it serves to increase the effective permeability of the core structure 40 relative to the core structure 20. Second, it serves to provide a narrower and more well-defined path for the flux across the air gap which greatly reduces the amount of radiated EMI from the core structure 40. Third, it may eliminate or reduce the need for EMI filtering or shields for the core structure 40.

In one embodiment, a ferrite core having a permeability of around 2200u is utilized to form a core structure for an inductor having an overall permeability of about 70u including the air gap. A sliver of NiZn having a permeability of approximately 500-700u is disposed in the place of an edge of an I-shaped core. The overall permeability of the core structure is then about 150-200u, and the sliver of NiZn significantly reduces the fringe flux that would otherwise cause undesirable EMI. If ferrite were used for the layer (as opposed to the NiZn), the overall permeability of the core structure would increase to a number higher than 150-200u. This might be undesirable as it is also important to consider the saturation of the magnetic field (B) in the core. Since the magnetic field in the core is directly proportional to the overall penneability of the core structure, increasing the overall permeability of the core could make it easier to saturate, which might be undesirable. For this reason NiZn is used rather than ferrite. It may be desirable to use other materials that have a higher flux density saturation point than NiZn, and also have a suitable permeability. Without limitation, one example of another suitable material for the layer 54 would be iron powder, which has a flux density saturation point of 0.7-1.5 Tesla as opposed to ferrites and NiZn which may be in the range of 0.3-0.5 Tesla.

The disclosure will, now turn to EMI filters. AC-to-DC power supplies typically generate common-mode and differential-mode electromagnetic interference (EMI), which conducts and radiates out of the AC line cord. For cases such as critical conduction mode (CrCM) power factor converters, which generate large components of differential mode noise (i.e., noise between the two power lines), the power supplies often use a common-mode filter to filter the common-mode noise (i.e., noise conducted on both power lines), and a differential-mode filter to filter the differential-mode noise. For cases in which the differential mode noise is relatively small, the common-mode filter is often intentionally designed to have a relatively high amount of leakage, thereby causing the differential-mode filtering, needed to substantially remove the small differential mode noise.

In the case of critical conduction mode power factor converters, the EMI filter may be large since it requires a large differential mode filter as well as a common mode filter. In the case of other AC-to-DC converters in which the differential mode noise is lower and the common-mode filter is designed to have a large leakage inductance, the common-mode filters must be made large to avoid saturation, and typically converters require at least two stages of common-mode filtering due to trade-offs in the filter design entailed in designing them for high leakage.

Taught here is the integration of the differential-mode filter and common-mode filter onto a common core. The resulting filter is smaller than if separate filters were utilized, which can be important in space constrained applications. Additionally, the total material is reduced, which causes the overall price to be lower. Further, since the common-mode filter can be optimized for common-mode performance rather than for high leakage, the overall filter performance is also improved.

FIG. 3 illustrates a prior art single common-mode or differential mode choke 60 that includes two windings 68 and 70 wrapped around a rectangular toriodal core 62. As can be seen, the core 62 includes a pair of legs 64 and 66 around which the separate windings 68 and 70 are provided, respectively. When implemented as a common-mode choke, one winding may be connected in series with the Line of an AC power line, while the other winding may be connected in series with the Neutral of the AC power line.

Figure 4:
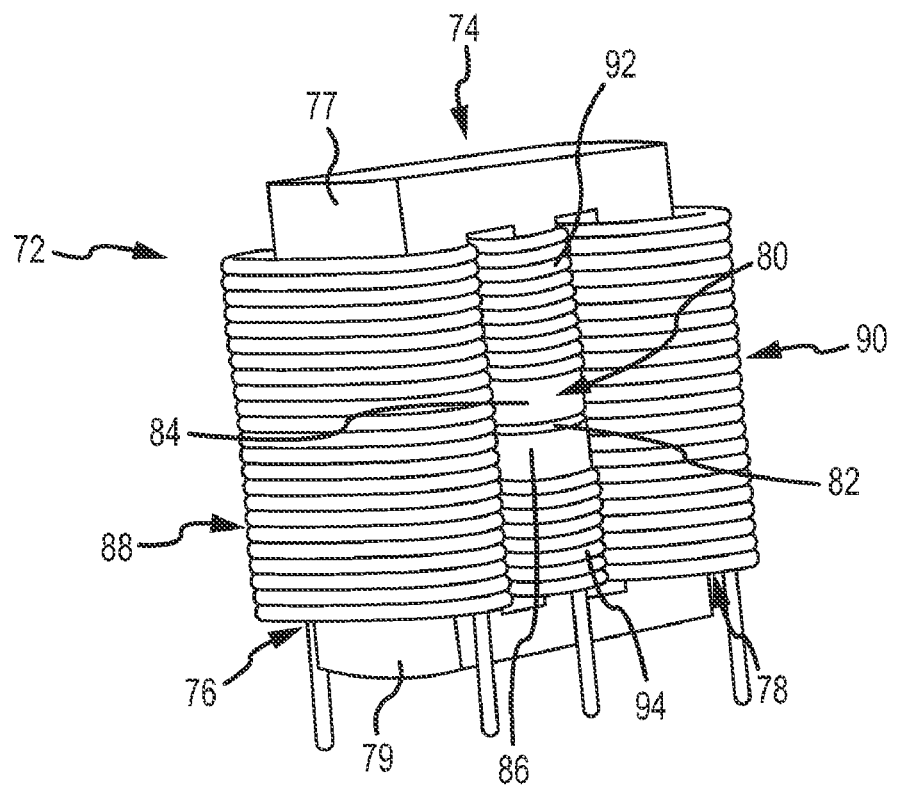
FIG. 4 is a representation of a choke on a single core that can be used to filter both common-mode noise and differential-node noise.

FIG. 4 illustrates a combined common-mode and differential-mode choke 72 in accordance with one embodiment. The core 74 includes an outer rectangular-shaped section having a pair of legs 76 and 78 and a top 77 and bottom 79, and a center leg section 80 also connected to the top 77 and bottom 79. The center leg section 80 includes a small air gap 82 between an upper center leg 84 and a lower center leg 86. The legs 76 and 78 have windings 88 and 90 provided thereon, respectively. The center legs 84 and 86 have windings 92 and 94 provided thereon, respectively. In operation, the windings 88 and 90 on the outer legs 76 and 78 may be used to form the common mode noise filters while the windings 92 and 94 on the center legs 84 and 86 may be used to form the differential-mode noise filter. As can be appreciated, the lower permeability differential-mode noise filter shares the outer limbs of the core structure with the higher permeability common-mode noise filter.

The disclosure will now tug to integrated two stage AC-DC converter magnetics. AC-to-DC converters that provide power factor correction (PFC) typically use a multi-stage converter that comprises a boost converter to boost a rectified AC source voltage to a high-voltage bus, and also comprises an isolated step-down converter to produce an isolated low-voltage DC output from the high-voltage non-isolated bus. The magnetic components used comprise, at a minimum, a PFC choke for the PFC converter and the isolated transformer for the step-down isolation stage. These two separate magnetic components comprise a noticeable amount of cost and space occupied by the power converter.

Figure 5:
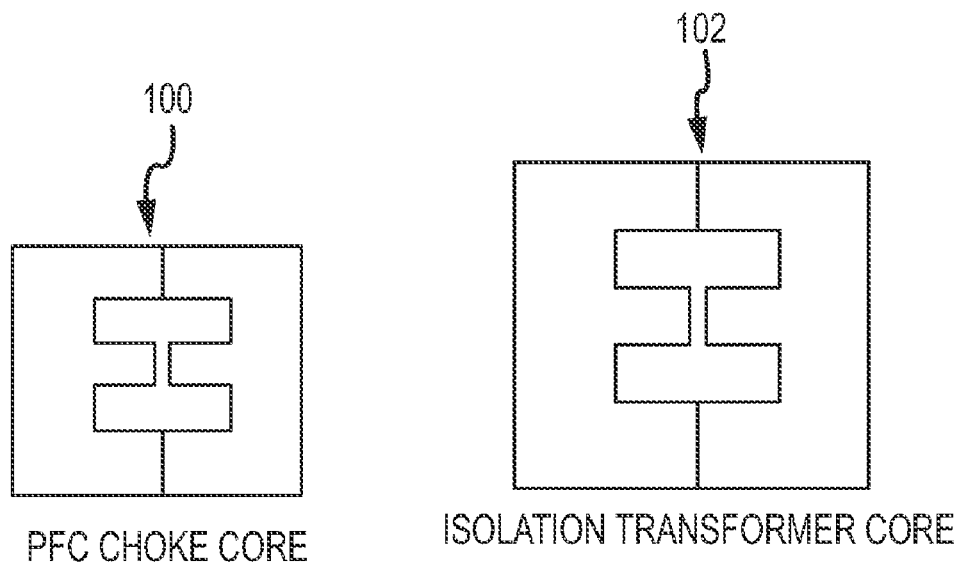
FIG. 5 is a representation of a pair of separate core structures that are used to form a pair of separate inductive elements.
Figure 6:
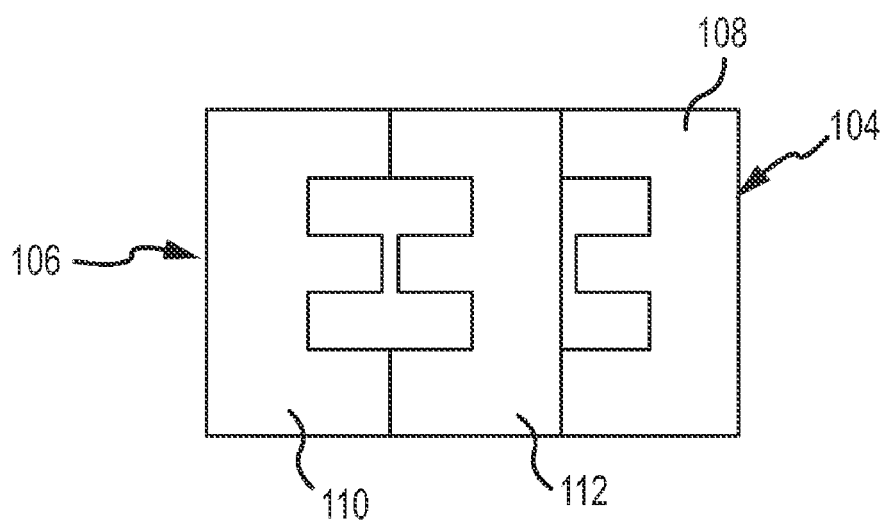
FIG. 6 is a representation of an integrated core structure that is used to form a pair of separate inductive elements.
Figure 8:
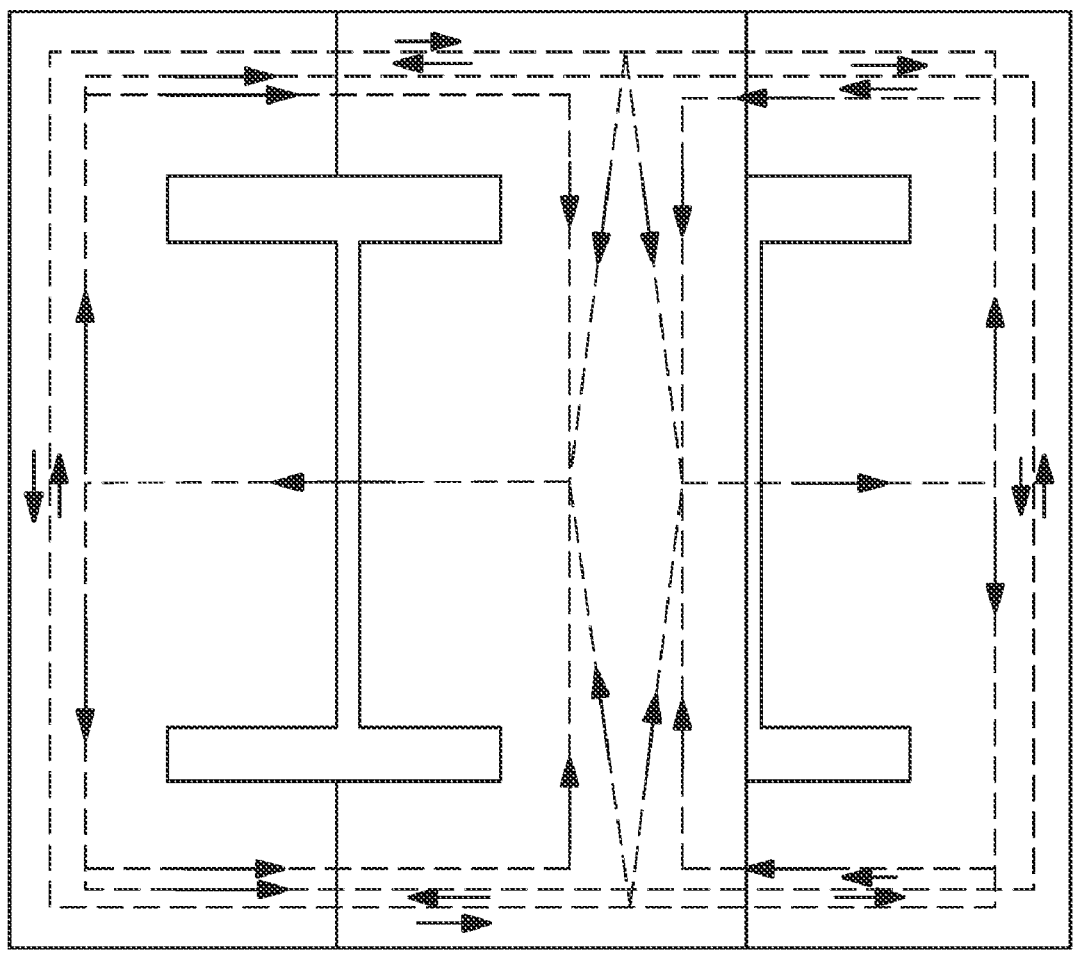
FIG. 8 is an illustration of lines of magnetic flux flowing in the integrated core structure of FIG. 6.

Taught herein is the integration of the PFC choke and the isolation transformer into a single core structure. In the prior art, the isolation transformer and the PFC choke are typically wound on separate E-E cores 100 and 102 as shown in FIG. 5. The disclosure herein teaches that a PFC choke core 104 can be incorporated into an isolation transformer core 106 by adding an additional E core 108 onto the E-E core of the isolation transformer (which includes a pair of E cores 110 and 112), as shown in FIGS. 6 and 8. The return path of flux for the PFC choke primarily uses a leg of the isolation transformer E-E core although, as can be seen in FIG. 8, some flux flows through each of the various routes to return back to the PFC. Thus, the size of at least a portion of the E-E core of the isolation transformer may be increased slightly to accommodate the additional flux due to the flux sharing arrangement between the PFC choke and the isolation transformer.

Figure 7:
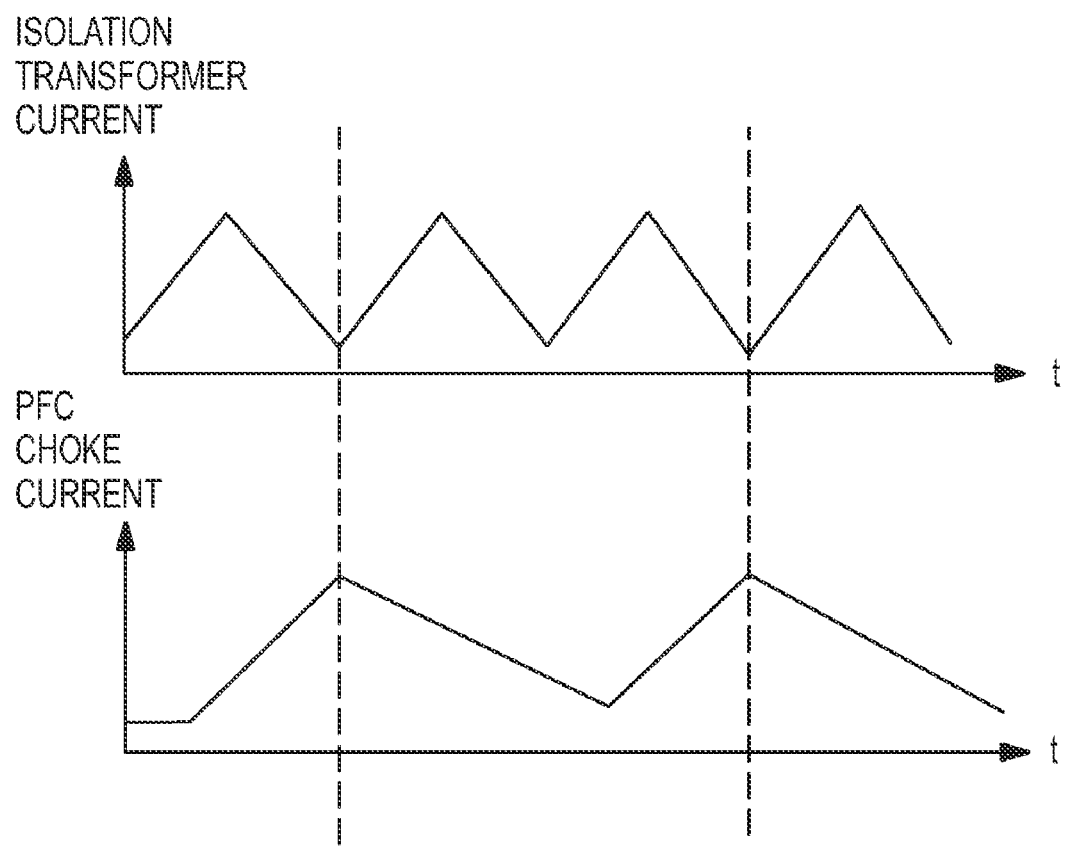
FIG. 7 is an illustration of current versus time in the pair of inductive elements of FIG. 6.

In low power AC-to-DC converters that provide PFC, the PFC converter is typically operated using critical conduction mode, which causes a wide operating range of frequency for the PFC converter section Since the isolation stage is typically operated at nearly constant frequency, it may not be practical to align the current between the two converter stages for AC-to-DC converters that employ critical conduction mode PFC converters. However, in higher power AC-to-DC converters, the PFC converter stage is typically operated at a constant or nearly constant frequency. In these cases, it may be feasible to operate the PFC stage and subsequent isolation stage at nearly constant frequencies and synchronize the stages in such a way that the return path of flux in the PFC choke plus the path of flux in the nearest E-E core leg is minimized. If the converter stages are synchronized in this manner, the size of the E-E core may be minimized so that the E-E core is no larger for the integrated magnetic structure than it would be for the isolated transformer core. An example of this synchronization is shown in FIG. 7. As can be seen, the timing of the current through the PFC choke is controlled so that its peak aligns with a valley of the current passing through the isolation transformer. As shown, the frequency of the current passing through the PFC choke and the isolation transformer may be multiples of each other (including the same frequency), such that the peak of one aligns with the valley of the other (or at least the peaks of both never coincide with each other). In this regard, the size of the E-core that is being shared by the transformer and the PFC choke may be minimized that is, the E-core does not need to be designed to handle the sum of the maximum flux from both the PFC choke and the isolation transformer at the same time.

The aforementioned implementations decrease component count, decrease overall cost, and reduce the size of the resulting power converter Synchronization of the two converter stages provides a further benefit in reduction of the core size and cost.

The disclosure will now turn to stackable converter magnetics. AC-to-DC, converters typically contain at least two converter stages and several sections for each converter. A typical example would be an AC-to-DC converter that provides power factor correction. AC-to-DC converters that provide power factor correction (PFC) typically use a multi-stage converter that comprises a boost converter to boost a rectified AC source voltage to a high-voltage bus, and also comprise an isolated step-down converter to produce an isolated low-voltage DC output from the high-voltage non-isolated bus. The magnetic components used comprise, at a minimum, the PFC choke for the PFC converter and the isolated transformer for the step-down isolation stage. These two magnetic components comprise a noticeable amount of cost and space occupied by the power converter.

AC-to-DC converters also typically include an EMI filter coupled to the AC power source. The EMI filter usually comprises two common-mode chokes or a common-mode and a differential-mode choke. Additionally, the isolated step-down converter typically comprises at least one inductor, either a large filter inductor or a resonant inductor. As described above, AC-to-DC converters typically comprise a significant number of separate magnetic components. These magnetic components contribute a significant amount of cost and space usage for any power converter.

As taught herein, two or more of the magnetic elements are stacked in such a way as to share one side of a core for two adjacent components. The shared core edges may be somewhat smaller than the combination of the two core edges they replace, so the total volume of core material is reduced. Furthermore, the component count is reduced as well as the total space utilized by the magnetics. In some cases, the core volume reduction may be substantial. Also, in certain cases described below, a converter may be operated in such a fashion as to further increase the core volume reduction obtained using this technique.

Figure 9:
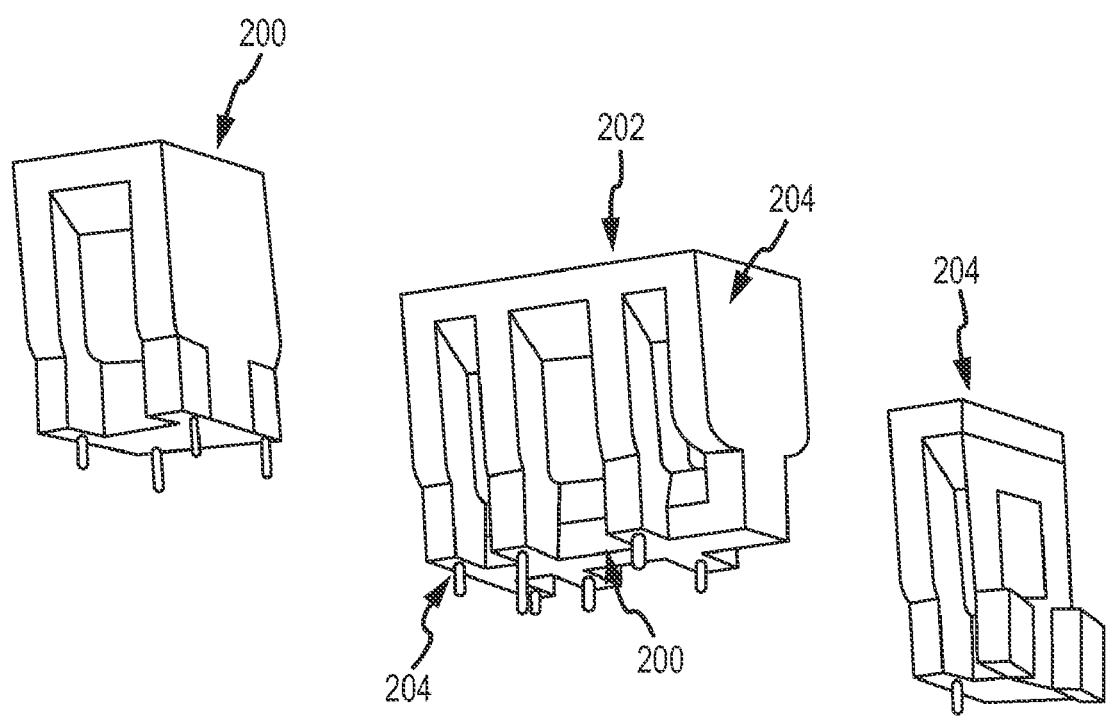
FIG. 9 is an illustration of three separate core structures for three separate inductive elements that are stackable together.

FIG. 9 shows two separate magnetic component building blocks 200, and 204 that are stackable into a single stacked assembly 202 for an entire power converter. Each magnetic component 200 and 204 is wound on a core that has a determined mechanical cross-section. The core area is controlled by changing the thickness of the core walls (shown as the horizontal dimension in FIG. 9). Each magnetic component contains a core wall on at least one side in addition to top and bottom, while some contain core walls on both sides (e.g., 200). In the case of assembly 202, it can be seen that component building block 200 is the central portion of 202, while component building block 204 can be used at either end of assembly 202. Of course, component building block is flipped around before being used on the right-hand side of assembly 202. As shown in FIG. 9, the cores can be stacked with each other since they all have the same mechanical cross-section and approximate size. The core wall for each section provides a flux path for that section as well as for the adjacent section. The end sections in the stack contain a core wall on both sides rather than only one side, since the end sections only have one section adjacent to them.

The magnetic structure shown in FIG. 9 can include any of the magnetic elements in the AC-to-DC converter including but not limited to the EMI filter chokes, the PFC boost inductor, the isolation transformer, a resonant inductor, output filter chokes, or the like. In one embodiment, the elements may be stacked such that the magnetic elements located on the primary side of the transformer are located at one end of the stack, magnetic elements located on the secondary side of the transformer are located at the other end of the stack, and the isolation transformer is located between the primary-side and secondary-side magnetic components. A smaller number of magnetic elements could also be stacked as is convenient for a design. Some specific cases of magnetic stacking and associated advantages are described below.

Figure 10:
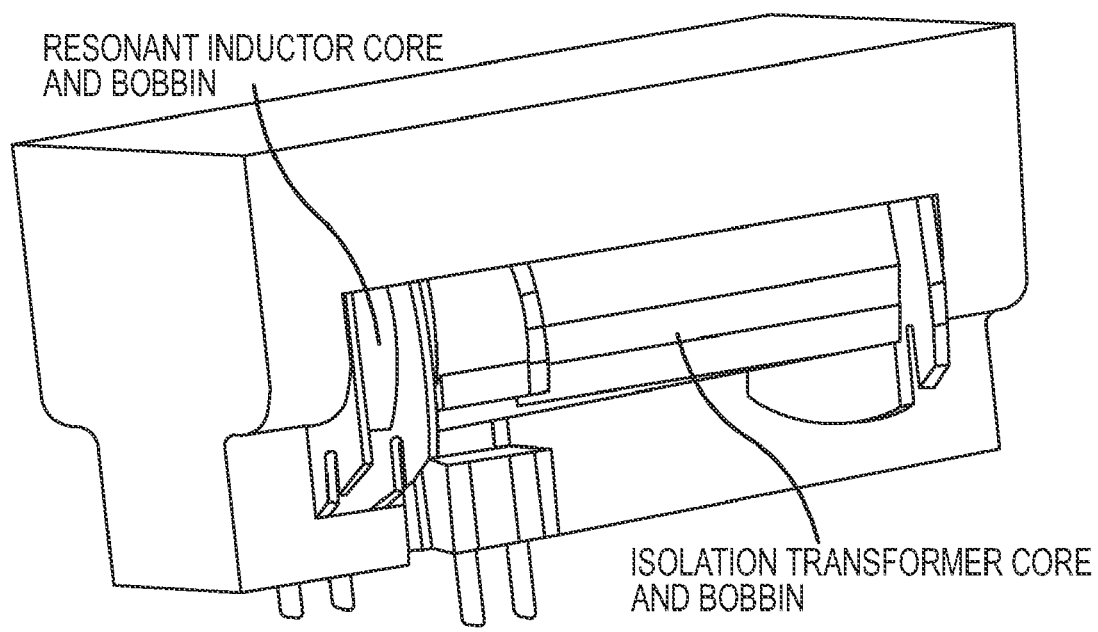
FIG. 10 is a stack of inductive elements.

It is common practice in resonant converter designs to use the parasitic leakage inductance of the transformer as the resonant inductor. This practice may limit a design by causing non-optimal transformer construction to obtain high inductance values. By using the stackable magnetics method, one can integrate a resonant inductor with the isolation transformer, thereby allowing an optimal transformer design and allowing easy change of the resonant inductance value. FIG. 10 shows what the resulting magnetic structure may look like.

Higher power PFC converters are sometimes split into two identical parallel PFC converters that are operated 180 degrees out of phase with each other. The two identical PFC converters share a common input voltage and a common output capacitor. By operating the gate drives of the semiconductor switches 180 degrees out of phase with each other, the combined inductor ripple current for the two converters is substantially reduced compared with the current from each converter individually.

Figure 11:
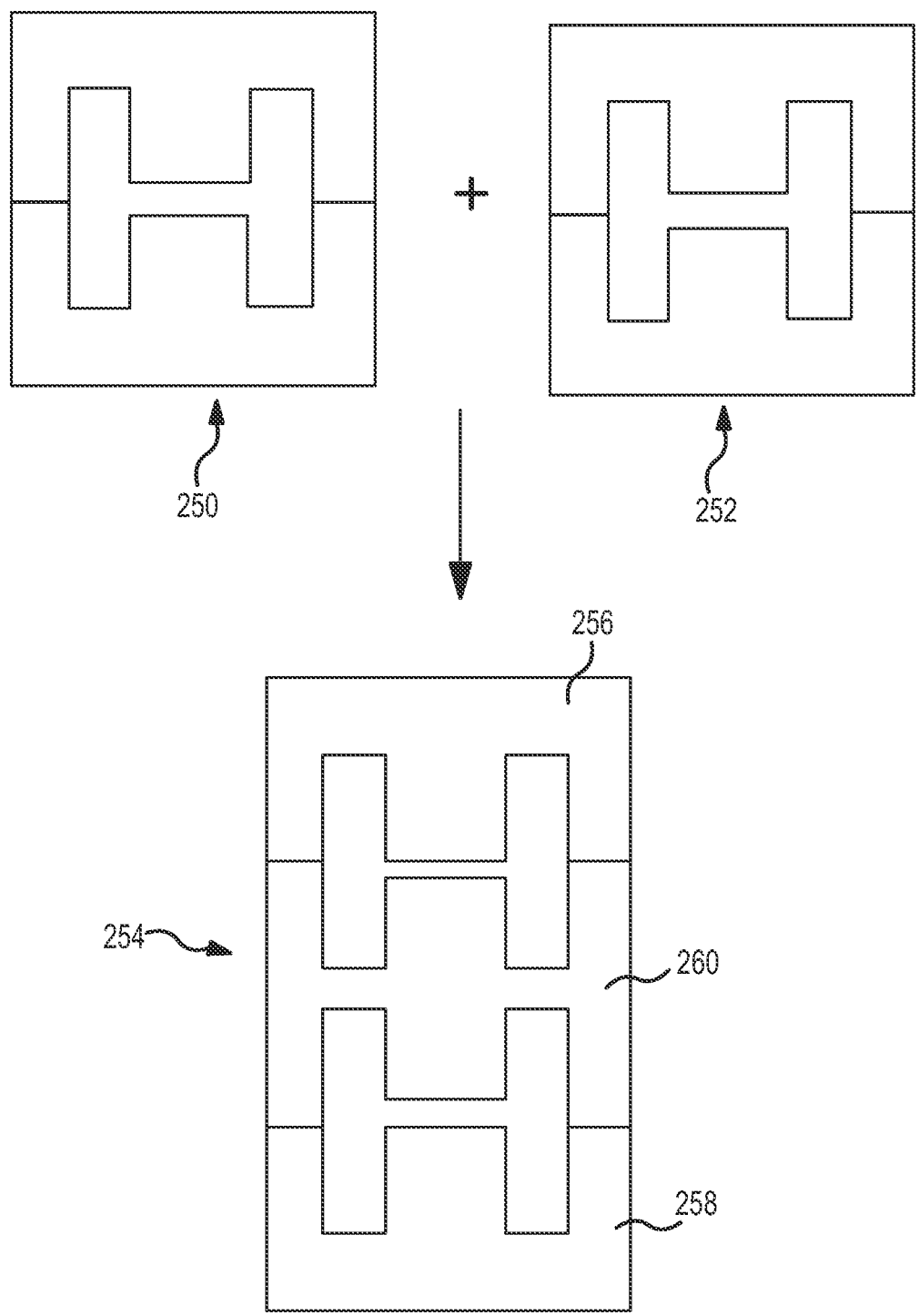
FIG. 11 is an illustration of two separate magnetic cores for two inductive elements that can be stacked and integrated together so that a portion of the core common to each is shared.

The flux in the two PFC chokes is also 180 degrees out of phase with each other. There is therefore substantial cancellation of flux in a common core edge when one stacks the cores in the manner described herein. One can therefore realize a substantial decrease in overall magnetic material by stacking these two cores and eliminating a common edge. FIG. 11 shows how the two cores 250 and 252 may be combined into a single core 254 with significantly reduced overall core volume. The cores 250 and 252 each include a pair of E-shaped core elements that face each other. Core 254 includes a pair of E-shaped core elements 256 and 258, with a uniquely-shaped common core element 260 sandwiched therebetween. Common core element 260 is shaped like a pair of E-sections joined together with their respective legs facing outward, and their respective longitudinal sections abutted together.

It should also be appreciated that various techniques may be used to minimize the required volume of the entire stackable converter magnetic structure. For example, the timing and operation of each of the individual components may be analyzed to determine the optimal position in the stack for each component that minimizes the volume required. Further, as discussed above, the current in the various components may be "synchronized" with each other to reduce the maximum instantaneous flux that passes through any one section of the core structure.

Additionally, the stacked magnetic components may have different core areas and different core dimensions (e.g. stacking a small 3-walled core onto a large core to complete the last of the 4 walls) that may be desirable to implement particular components for particular applications.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

What is claimed:

1. An inductive element for an electronic circuit, the element comprising:
   a magnetic core assembly including an E-section and an I-section, the core assembly having an overall permeability, the core assembly being composed of a first material for at least a substantial majority of the assembly, the first material having a permeability, and having a layer of material having a permeability higher than the overall permeability and lower than the permeability of the first material sandwiched between the E-section and the I-section and adjacent to at least one side of air gap formed between a center leg of the E-section and an edge of the layer of material; and
   a coil of conductive material circumferentially surrounding at least a portion of the core assembly.

2. An inductive element as defined in claim 1, wherein the layer of material includes NiZn.

3. An inductive element as defined in claim 1, wherein the layer of material includes iron powder.

4. An inductive element as defined in claim 1, wherein the layer has a permeability greater than 300u and the overall permeability of the core assembly is less than 300u.

5. An inductive element as defined in claim 1, wherein the first material has a permeability greater than 2000u and the layer has a permeability less than 1000u.

6. The inductive element as defined in claim 1, wherein the layer of material is thin relative to a width of the I-section.

7. An inductive element for an electronic circuit, the element comprising:
   a magnetic core assembly having three core legs around which windings can be provided, including a first leg, a second leg, and a third leg, wherein the third leg includes an air gap such that the third leg is divided into two leg sections;
   a first winding around the first leg, a second winding around the second leg, and a third winding and a fourth winding around respective ones of the two leg sections of the third leg;
   wherein the first and second windings are used for filtering common-mode noise and the third and fourth windings are used for filtering differential-mode noise.

8. An inductive element as defined in claim 7, wherein the first winding has the same number of turns as the second winding and the third winding has the same number of turns as the fourth winding.

9. An inductive element as defined in claim 7, wherein a first end of the first leg, the second leg, and the third leg are all attached to a top core element and a second end of the first leg, the second leg, and the third leg are all attached to a bottom core element.

10. An inductive element assembly for an electronic circuit, the assembly comprising:
    a first inductive element having a first magnetic core and a first pair of windings;
    a second inductive element having a second magnetic core and a second pair of windings;
    wherein the second magnetic core is connected to the first magnetic core and the magnetic flux generated by the second inductive element passes from the second magnetic core to the first magnetic core and back to the second magnetic core and wherein alternating current flowing in the first and second pair of windings is synchronized so that the peak current does not flow through the two pairs of windings simultaneously.

11. An inductive element assembly as defined in claim 10, wherein the first inductive element is shaped as a pair of E-sections.

12. An inductive element assembly as defined in claim 10, wherein the second inductive element is shaped as a E-section.

13. An inductive element assembly as defined in claim 12, wherein the first inductive element is shaped as a pair of E-sections.

14. An inductive element assembly for an electronic circuit, the assembly comprising:
    a first inductive element having a first magnetic core and a first pair of windings;
    a second inductive element having a second magnetic core and a second pair of windings; and
    a third inductive element having a third magnetic core and a third pair of windings;
    wherein:
       the first, second, and third inductive elements have substantially the same cross-sectional shape;
       the three inductive elements are stacked on top of each other; and
       alternating current flowing in the first and second pair of windings is synchronized so that the peak current does not flow through the two pair of windings simultaneously.

15. An inductive element assembly as defined in claim 14, wherein the first magnetic core includes an E-section and a common core section, and further wherein the second magnetic core includes an E-section and the common core section.

16. An inductive element assembly as defined in claim 14, wherein a common core section is formed between the first and second inductive elements in the shape of a pair of E-sections that are joined together with their longest longitudinal sections abutted against each other.

17. An inductive element assembly as defined in claim 14, wherein the first inductive element and the second inductive element have substantially the same cross-sectional size.

18. The inductive element assembly as defined in claim 14 wherein the first, second, and third inductive elements have substantially the same cross-sectional size.

* * * * *